United States Patent
Chiang et al.

(10) Patent No.: US 8,304,891 B2
(45) Date of Patent: Nov. 6, 2012

(54) SEMICONDUCTOR PACKAGE DEVICE, SEMICONDUCTOR PACKAGE STRUCTURE, AND FABRICATION METHODS THEREOF

(75) Inventors: Cheng-Chia Chiang, Taichung Hsien (TW); Chin-Huang Chang, Taichung Hsien (TW); Chien-Ping Huang, Taichung (TW); Chih-Ming Huang, Hsinchu Hsein (TW); Jung-Pin Huang, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 284 days.

(21) Appl. No.: 12/315,787

(22) Filed: Dec. 4, 2008

(65) Prior Publication Data
US 2009/0294959 A1 Dec. 3, 2009

(30) Foreign Application Priority Data
May 28, 2008 (TW) ................. 97119623 A

(51) Int. Cl.
*H01L 23/28* (2006.01)
*H01L 23/31* (2006.01)
*H01L 23/52* (2006.01)
*H01L 23/00* (2006.01)

(52) U.S. Cl. ........ 257/698; 257/621; 257/737; 257/738; 257/704; 257/659; 257/660; 257/787; 257/796; 257/E23.011; 257/E23.116; 257/E23.123; 257/E23.124; 257/E23.126

(58) Field of Classification Search ................. 257/698, 257/659, 660, 621, 787, 737, 738, 796, 704, 257/E23.011, E23.114, E23.116, E23.123, 257/E23.124, E23.126; 438/113, 114
See application file for complete search history.

(56) References Cited

U.S. PATENT DOCUMENTS

| | | | |
|---|---|---|---|
| 5,202,754 A | 4/1993 | Bertin et al. | |
| 5,270,261 A | 12/1993 | Bertin et al. | |
| 6,087,202 A * | 7/2000 | Exposito et al. | 438/113 |
| 6,294,731 B1 * | 9/2001 | Lu et al. | 174/388 |
| 6,400,032 B1 * | 6/2002 | Akram | 257/778 |
| 6,486,554 B2 * | 11/2002 | Johnson | 257/738 |
| 6,601,293 B1 * | 8/2003 | Glenn | 29/841 |
| 6,630,727 B1 * | 10/2003 | Tutsch et al. | 257/668 |
| 6,649,446 B1 * | 11/2003 | Goetz et al. | 438/110 |
| 7,002,236 B2 * | 2/2006 | Ito | 257/587 |
| 7,132,312 B2 * | 11/2006 | Huang et al. | 438/113 |
| 7,187,071 B2 * | 3/2007 | Tsuneoka et al. | 257/691 |
| 7,198,987 B1 * | 4/2007 | Warren et al. | 438/112 |
| 7,261,596 B2 * | 8/2007 | Akaike et al. | 439/607.01 |
| 7,553,752 B2 * | 6/2009 | Kuan et al. | 438/613 |
| 7,629,674 B1 * | 12/2009 | Foster | 257/659 |
| 7,642,128 B1 * | 1/2010 | Lin et al. | 438/106 |
| 7,700,411 B2 * | 4/2010 | Yang et al. | 438/109 |
| 7,772,081 B2 * | 8/2010 | Lin et al. | 438/393 |
| 7,838,337 B2 * | 11/2010 | Marimuthu et al. | 438/110 |

(Continued)

*Primary Examiner* — Mary Wilczewski
(74) *Attorney, Agent, or Firm* — Peter F. Corless; Steven M. Jensen; Edwards Wildman Palmer LLP

(57) ABSTRACT

A semiconductor package device, a semiconductor package structure, and fabrication methods thereof are provided, which mainly includes disposing a plurality of semiconductor chips on a wafer formed with TSVs (Through Silicon Vias) and electrically connecting the semiconductor chips to the TSVs; encapsulating the semiconductor chips with an encapsulant; and disposing a hard component on the encapsulant. The hard component ensures flatness of the wafer during a solder bump process and provides support to the wafer during a singulation process such that the wafer can firmly lie on a singulation carrier, thereby overcoming the drawbacks of the prior art, namely difficulty in mounting of solder bumps, and difficulty in cutting of the wafer.

11 Claims, 3 Drawing Sheets

U.S. PATENT DOCUMENTS

| | | | | |
|---|---|---|---|---|
| 7,838,975 B2 * | 11/2010 | Chen | | 257/676 |
| 7,843,072 B1 * | 11/2010 | Park et al. | | 257/774 |
| 7,851,246 B2 * | 12/2010 | Camacho et al. | | 438/51 |
| 7,851,893 B2 * | 12/2010 | Kim et al. | | 257/659 |
| 7,858,441 B2 * | 12/2010 | Lin et al. | | 438/109 |
| 7,872,936 B2 * | 1/2011 | Blankenship | | 365/230.03 |
| 7,880,293 B2 * | 2/2011 | Han et al. | | 257/698 |
| 7,906,857 B1 * | 3/2011 | Hoang et al. | | 257/783 |
| 7,955,895 B2 * | 6/2011 | Yang et al. | | 438/108 |
| 2004/0231872 A1 * | 11/2004 | Arnold et al. | | 174/35 R |
| 2004/0240191 A1 * | 12/2004 | Arnold et al. | | 361/800 |
| 2005/0139994 A1 * | 6/2005 | Hsu et al. | | 257/706 |
| 2006/0194370 A1 * | 8/2006 | Lee et al. | | 438/118 |
| 2006/0267159 A1 * | 11/2006 | Yamamoto et al. | | 257/659 |
| 2007/0023895 A1 * | 2/2007 | Watanabe et al. | | 257/724 |
| 2007/0045829 A1 * | 3/2007 | Jeong et al. | | 257/723 |
| 2007/0164409 A1 * | 7/2007 | Holland | | 257/678 |
| 2008/0061407 A1 * | 3/2008 | Yang et al. | | 257/660 |
| 2008/0112037 A1 * | 5/2008 | Pan et al. | | 359/291 |
| 2008/0173990 A1 * | 7/2008 | Haga et al. | | 257/675 |
| 2009/0091029 A1 * | 4/2009 | Ano et al. | | 257/737 |
| 2009/0160043 A1 * | 6/2009 | Shen et al. | | 257/690 |
| 2009/0160071 A1 * | 6/2009 | Shen | | 257/786 |
| 2009/0261460 A1 * | 10/2009 | Kuan et al. | | 257/660 |
| 2009/0294928 A1 * | 12/2009 | Kim et al. | | 257/659 |
| 2009/0294959 A1 * | 12/2009 | Chiang et al. | | 257/737 |
| 2009/0315156 A1 * | 12/2009 | Harper | | 257/660 |
| 2010/0029045 A1 * | 2/2010 | Ramanathan et al. | | 438/114 |
| 2010/0052156 A1 * | 3/2010 | Appelt et al. | | 257/712 |
| 2010/0072582 A1 * | 3/2010 | Chandra et al. | | 257/659 |
| 2010/0259296 A1 * | 10/2010 | Or-Bach | | 326/38 |
| 2010/0264512 A1 * | 10/2010 | Lin et al. | | 257/528 |
| 2010/0270656 A1 * | 10/2010 | Do et al. | | 257/620 |
| 2010/0276769 A1 * | 11/2010 | Theuss et al. | | 257/421 |
| 2011/0018114 A1 * | 1/2011 | Pagaila et al. | | 257/686 |
| 2011/0031598 A1 * | 2/2011 | Lee et al. | | 257/686 |
| 2011/0031619 A1 * | 2/2011 | Chen et al. | | 257/738 |
| 2011/0031634 A1 * | 2/2011 | Pagaila | | 257/777 |
| 2011/0037155 A1 * | 2/2011 | Pagaila | | 257/686 |
| 2011/0037169 A1 * | 2/2011 | Pagaila | | 257/737 |
| 2011/0304015 A1 * | 12/2011 | Kim et al. | | 257/532 |

* cited by examiner

SEMICONDUCTOR PACKAGE DEVICE, SEMICONDUCTOR PACKAGE STRUCTURE, AND FABRICATION METHODS THEREOF

BACKGROUND OF THE INVENTION

1. Field of the Invention

The present invention relates generally to semiconductor package devices, semiconductor package structures, and fabrication methods thereof, and more particularly to a semiconductor package device with TSVs (Through Silicon Vias), a semiconductor package structure, and fabrication methods thereof.

2. Description of Related Art

Along with the development of electronic products and the requirement for high integration of semiconductor chips, TSV technique based on deep silicon etching has been proposed and disclosed in such as U.S. Pat. No. 5,270,261 and No. 5,202,754.

Referring to FIGS. 2A to 2E, a conventional fabrication method of a semiconductor device with TSVs is shown. As shown in the drawings, a wafer 20 with a plurality of openings 201 formed on a first surface thereof is provided, wherein the openings 201 are filled with a metal material 21, and solder pads 22 are formed on the metal material 21 and adhered to a carrier 24 through an adhesive material 23. Then, the wafer 20 is thinned through a grinding process such that the metal material 21 can be exposed through a second surface of the wafer 20 opposed to the first surface with the solder pads 22. Meanwhile, the adhesive material 23 and the carrier 24 are removed. Thereafter, semiconductor chips 30 are disposed on the second surface of the wafer 20 that exposes the metal material 21 so as to electrically connect the wafer 20. Further, a plurality of solder bumps 31 is mounted on the solder pads 22 of the wafer 20 such that the semiconductor chips 30 can be electrically connected to external devices through the solder bumps 31.

During mounting of the solder bumps, the second surface of the wafer 20 with the semiconductor chips 30 faces downward and the first surface of the wafer 20 with the solder pads 22 faces upward so as to mount the solder bumps 31 on the solder pads 22. However, since the semiconductor chips 30 have different thicknesses, the wafer 20 cannot be disposed in a flat manner, which can lead to position deviation of the solder bumps 31 during the solder bump process and difficulty in cutting of the wafer during a singulation process.

Therefore, how to provide a semiconductor device with TSVs and a fabrication method thereof so as to overcome the above-described drawbacks has become urgent.

SUMMARY OF THE INVENTION

According to the above drawbacks, an object of the present invention is to provide a semiconductor package device, a semiconductor package structure and fabrication methods thereof so as to improve flatness of the wafer during the solder bump process.

Another object of the present invention is to provide a semiconductor package device, a semiconductor package structure and fabrication methods thereof so as to facilitate cutting of the wafer during a singulation process.

A further object of the present invention is to provide a semiconductor package device, a semiconductor package structure and fabrication methods so as to prevent position deviation of the solder bumps.

Still another object of the present invention is to provide a semiconductor package device, a semiconductor package structure and fabrication methods thereof so as to protect semiconductor chips.

A further object of the present invention is to provide a semiconductor package device, a semiconductor package structure and fabrication methods thereof so as to improve the heat dissipating efficiency.

In order to attain the above and other objects, the present invention provides fabrication method of a semiconductor package device, which comprises: providing a wafer having a plurality of silicon substrates, wherein each of the silicon substrates has a first surface and an opposed second surface and a plurality of TSVs; disposing a plurality of semiconductor chips on the first surfaces of the silicon substrates, wherein the semiconductor chips are electrically connected to the TSVs; forming an encapsulant on the first surfaces of the silicon substrates to encapsulate the semiconductor chips; forming a hard component on the encapsulant; and forming a plurality of conductive elements on the second surfaces of the silicon substrates to electrically connect the TSVs. The method further comprises performing a singulation process to the wafer. The hard component is made of one of a glass material, a thermosetting material and a metal material.

Through the above-described fabrication method, a semiconductor package device is provided, which comprises: a silicon substrate having a first surface and an opposed second surface and a plurality of TSVs; a semiconductor chip disposed on the first surface of the silicon substrate and electrically connected to the TSVs; an encapsulant formed on the first surface of the silicon substrate to encapsulate the semiconductor chip; a hard component disposed on the encapsulant; and a plurality of conductive elements disposed on the second surface of the silicon substrate and electrically connected to the TSVs.

The present invention further discloses a fabrication method of a semiconductor package structure, which comprises: providing a wafer having a plurality of silicon substrates, wherein each of the silicon substrates has a first surface and an opposed second surface and a plurality of TSVs; disposing a plurality of semiconductor chips on the first surfaces of the silicon substrates, wherein the semiconductor chips are electrically connected to the TSVs; forming an encapsulant on the first surfaces of the silicon substrates to encapsulate the semiconductor chips; forming a hard component on the encapsulant; forming a plurality of conductive elements on the second surfaces of the silicon substrates to electrically connect the TSVs; and disposing a carrier to the conductive elements such that the carrier can be electrically connected to the semiconductor chips through the conductive elements.

Through the above-described fabrication method, a semiconductor package structure is provided, which comprises: a silicon substrate having a first surface and an opposed second surface and a plurality of TSVs; a semiconductor chip disposed on the first surface of the silicon substrate and electrically connected to the TSVs; an encapsulant formed on the first surface of the silicon substrate to encapsulate the semiconductor chip; a hard component disposed on the encapsulant; a plurality of conductive elements disposed on the second surface of the silicon substrate and electrically connected to the TSVs; and a carrier disposed to the conductive elements and electrically connected to the semiconductor chip through the conductive elements.

Therefore, the present invention mainly involves providing a wafer having a plurality of silicon substrates, wherein each of the silicon substrates has a first surface and an opposed second surface and a plurality of TSVs filled with a conductive material; disposing a plurality of semiconductor chips on the first surfaces of the silicon substrates with the semiconductor chips electrically connected to the TSVs; forming an encapsulant on the first surfaces of the silicon substrates to encapsulate the semiconductor chips; forming a hard component on the encapsulant; forming a plurality of conductive elements on the second surfaces of the silicon substrates; and then performing a singulation process to the wafer so as to separate the silicon substrates from each other, thereby forming a plurality of semiconductor package devices with TSVs. Further, the semiconductor package devices can be respectively electrically connected to carriers such as substrates, circuit boards or lead frames through the conductive elements so as to form semiconductor package structures. Therein, the hard component is made of a glass material, a metal material or a thermosetting material. The hard component ensures flatness of the wafer during mounting of the conductive elements. The hard component also provides support to the wafer such that the wafer can be firmly placed on a singulation carrier during the singulation process, thereby facilitating cutting of the wafer. In addition, the hard component provides protection to the semiconductor chips disposed therebelow, and the hard component made of a metal material improves the heat dissipating efficiency of the semiconductor package device.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention may also be implemented and applied according to other embodiments, and the details may be modified based on different views and applications without departing from the spirit of the invention.

FIGS. 1A to 1D are sectional views showing a semiconductor package device and a fabrication method thereof according to the present invention.

Figure 1A:
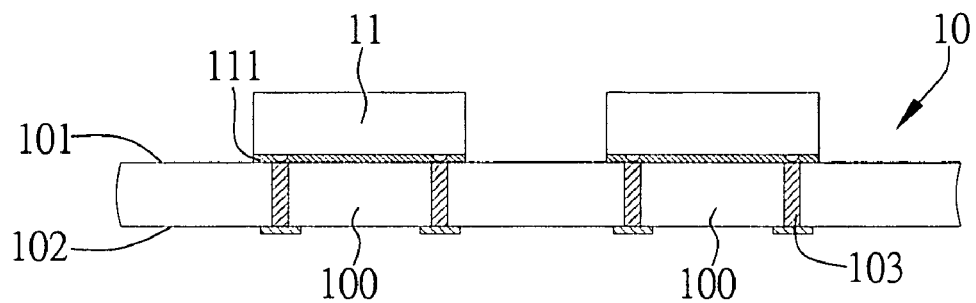
FIGS. 1A to 1D are sectional views showing a semiconductor package device and a fabrication method thereof according to the present invention.

As shown in FIG. 1A, a wafer 10 having a plurality of silicon substrates 100 is provided. Each of the silicon substrates 100 has a first surface 101 and a second surface 102 opposed to the first surface 101. A plurality of TSVs 103 is formed in each of the silicon substrates 100, wherein the TSVs 103 are filled with a conductive material. That is, at least a through hole is formed on the second surface 102 of the silicon substrate 100, a conductive material such as Cu or Ni/Au is filled in the through hole, and a grinding process is performed for thinning the first surface 101 of the silicon substrate 100 so as to expose the conductive material filled in the through hole, thus forming a TSV 103.

Subsequently, a plurality of semiconductor chips 11 is disposed on the first surfaces 101 of the silicon substrates 100 and electrically connected to the TSVs 103. Therein, an underfill adhesive 111 is filled between the silicon substrates 100 and the semiconductor chips 11 so as to reduce relative deformation of the wafer 10 and the semiconductor chips 11.

Figure 1B:
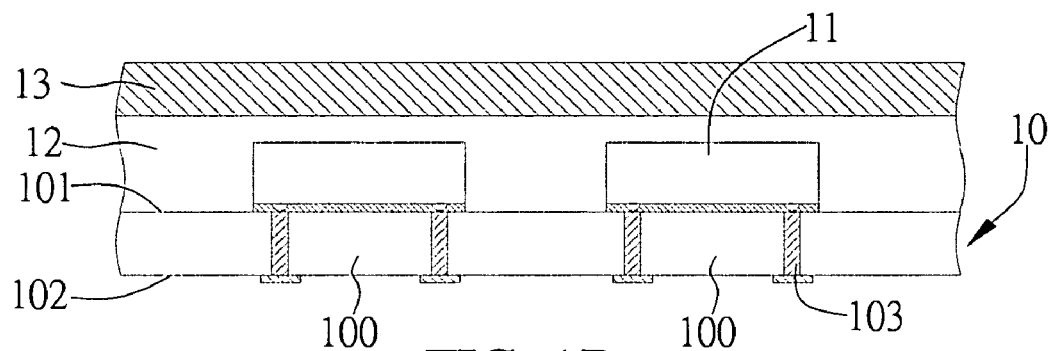

As shown in FIG. 1B, an encapsulant 12 is formed on the first surfaces 101 of the silicon substrates 100 so as to encapsulate the semiconductor chips 11.

Thereafter, a hard component 13 is formed on the encapsulant 12, wherein the hard component 13 may be made of a glass material, a metal material such as copper, or a thermosetting material such as a polyimide resin, a BT (Bismaleimide Triazine) resin, FR-4 and so on.

Figure 1C:
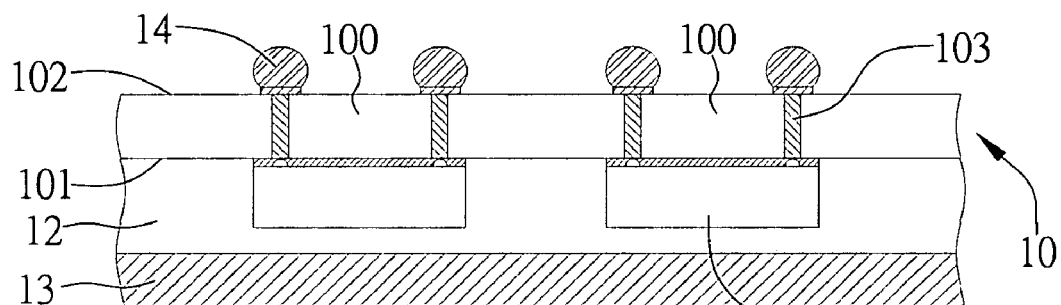

As shown in FIG. 1C, a plurality of conductive elements 14 such as solder bumps is formed on the second surfaces 102 of the silicon substrates 100 and electrically connected to the TSVs 103. Therein, during a solder bump process, the first surfaces 101 of the silicon substrates 100 with the hard component 13 face downward and the second surfaces 102 face upward so as to form the conductive elements 14 on the second surfaces 102. As a result, the semiconductor chips 11 can be electrically connected to an external device through the TSVs 103 and the conductive elements 14. Meanwhile, the hard component 13 ensures flatness of the wafer 10 during the solder bump process.

Figure 1D:
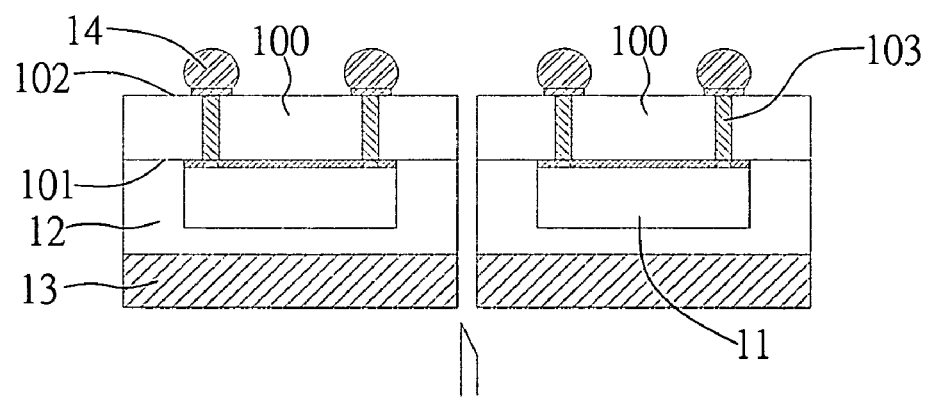

As shown in FIG. 1D, the wafer 10 is singulated to separate the silicon substrates 100 from each other, thereby forming a plurality of semiconductor package devices with TSVs 103. During the singulation process, since the hard component 13 made of a glass material, a metal material or a thermosetting material provides support for the wafer 10, the wafer 10 can be firmly placed on a carrier, thereby facilitating cutting of the wafer so as to form a plurality of semiconductor package devices.

Further, the hard component 13 that is disposed above the semiconductor chips 11 provides protection to the semiconductor chips 11. In addition, the hard component 13 made of a metal material improves the heat dissipating efficiency of the semiconductor package devices.

Further referring to FIGS. 1C to 1D, through the above-described fabrication method, a semiconductor package device is provided, which comprises: a silicon substrate 100 having a first surface 101, an opposed second surface 102 and a plurality of TSVs 103; a semiconductor chip 11 disposed on the first surface 101 and electrically connected to the TSVs 103; an encapsulant 12 formed on the first surface 101 of the silicon substrate 100 to encapsulate the semiconductor chip 11; a hard component 13 disposed on the encapsulant 12; and a plurality of conductive elements 14 disposed on the second surface 102 of the silicon substrate 100 and electrically connected to the TSVs 103.

Figure 1E:
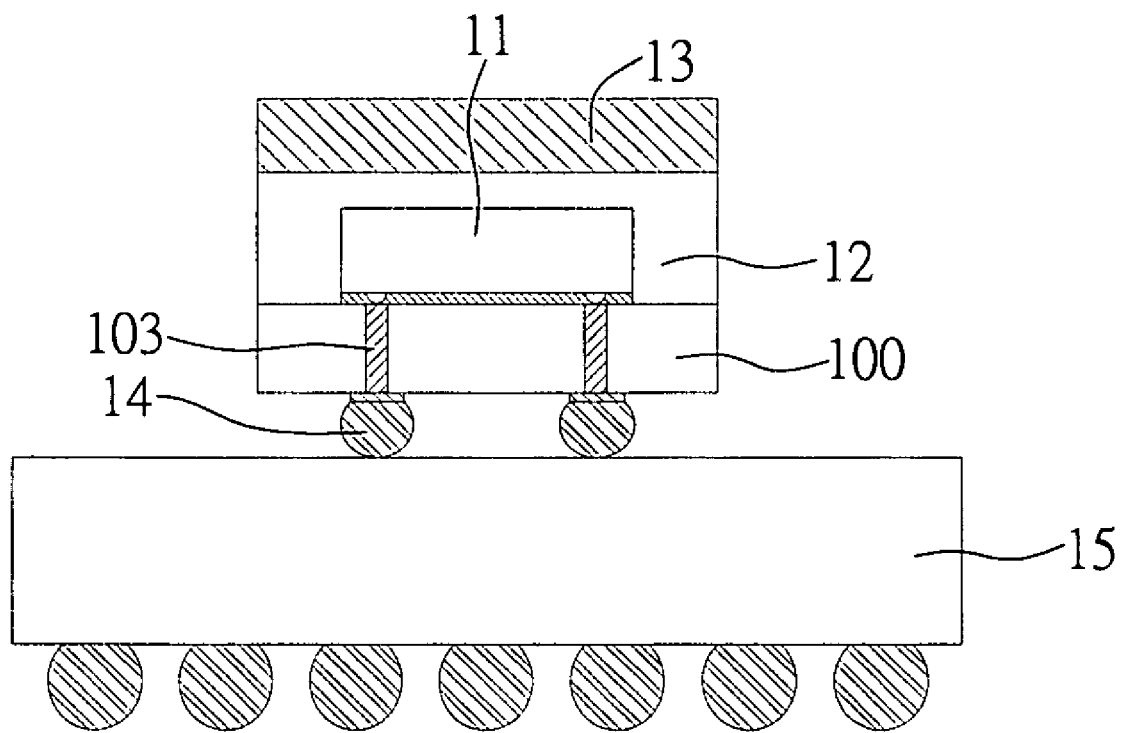
FIG. 1E is a sectional view showing a semiconductor package structure and a fabrication method thereof according to the present invention.
Figure 2A:
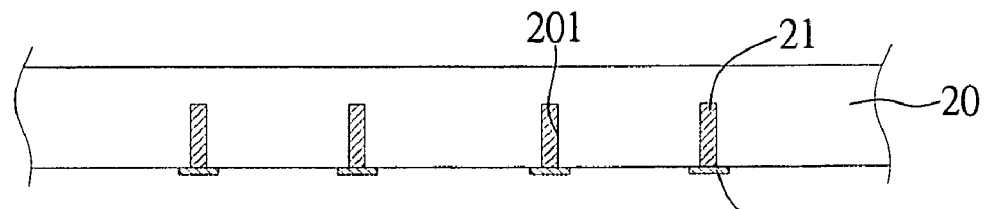
FIGS. 2A to 2E are sectional views showing a conventional fabrication method of a semiconductor device formed with TSVs.
Figure 2B:
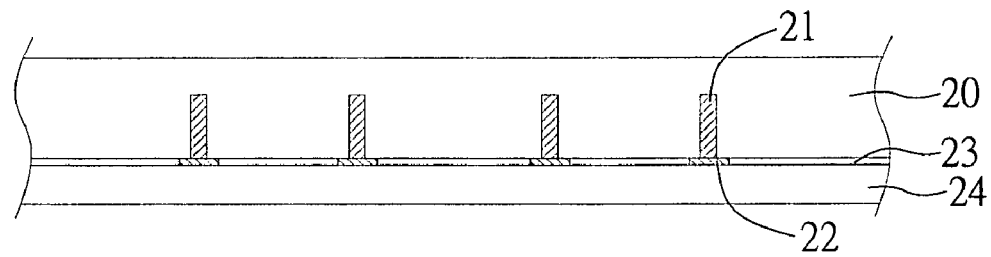
Figure 2C:
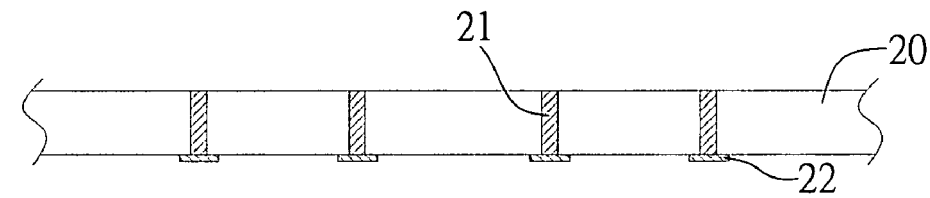
Figure 2D:
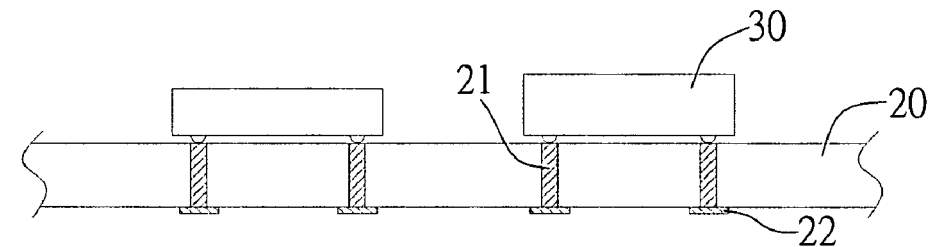
Figure 2E:
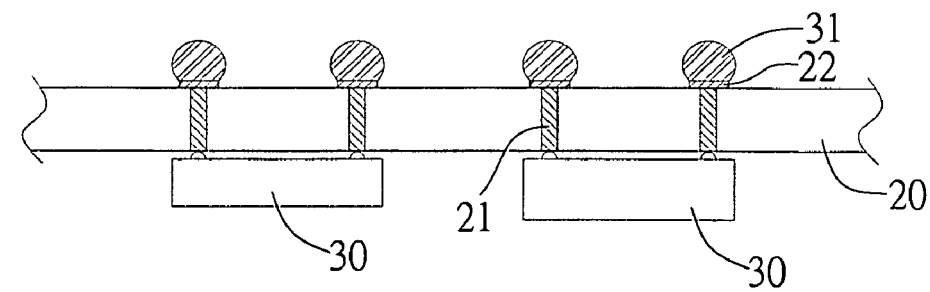

Referring to FIG. 1E, a semiconductor package structure according to the present invention is shown. Same as the above-described method, a wafer having a plurality of silicon substrates 100 with TSVs 103 is provided, with the TSVs 103 filled with a conductive material, a plurality of semiconductor chips 11 is disposed on the silicon substrates 100 and electrically connected to the TSVs 103, and an encapsulant 12 is formed on the silicon substrates 100 to encapsulate the semiconductor chips 11, then, a hard component 13 is formed on the encapsulant 12 and a plurality of conductive elements 14 is formed. Thereafter, a singulation process is performed to separate the silicon substrates 100 from each other, thereby forming a plurality of semiconductor package devices. Further, a carrier 15 is disposed to such a semiconductor package device so as to electrically connect the semiconductor chip 11 through the conductive elements 14, thereby forming a semiconductor package structure. The carrier 15 may be a substrate, a circuit board or a lead frame.

Through the above-described method, a semiconductor package structure is provided, which comprises: a silicon substrate 100 having a first surface 101 and an opposed second surface 102 and a plurality of TSVs 103; a semiconductor chip 11 disposed on the first surface 101 and electrically connected to the TSVs 103; an encapsulant 12 formed on the first surface 101 of the silicon substrate 100 to encapsulate the semiconductor chip 11; a hard component 13 disposed on the encapsulant 12; a plurality of conductive elements 14 disposed on the second surface 102 of the silicon substrate 100 and electrically connected to the TSVs 103; and a carrier 15 disposed to the conductive elements 14 so as to electrically connect the semiconductor chip 11 through the conductive elements 14.

Therefore, the present invention mainly involves providing a wafer having a plurality of silicon substrates, wherein each of the silicon substrates has a first surface and an opposed second surface and a plurality of TSVs filled with a conductive material; disposing a plurality of semiconductor chips on the first surfaces of the silicon substrates with the semiconductor chips electrically connected to the TSVs; forming an encapsulant on the first surfaces of the silicon substrates to encapsulate the semiconductor chips; forming a hard component on the encapsulant; forming a plurality of conductive elements on the second surfaces of the silicon substrates; and then performing a singulation process to the wafer so as to separate the silicon substrates from each other, thereby forming a plurality of semiconductor package devices with TSVs. Further, the semiconductor package devices can be respectively electrically connected to carriers such as substrates, circuit boards or lead frames through the conductive elements so as to form semiconductor package structures. Therein, the hard component is made of a glass material, a metal material or a thermosetting material. The hard component ensures flatness of the wafer during mounting of the conductive elements. The hard component also provides support to the wafer such that the wafer can be firmly placed on a singulation carrier during the singulation process, thereby facilitating cutting of the wafer. In addition, the hard component provides protection to the semiconductor chips disposed therebelow, and the hard component made of a metal material improves the heat dissipating efficiency of the semiconductor package device.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:
1. A semiconductor package device, comprising:
  a silicon substrate having a first surface and an opposed second surface and a plurality of Through Silicon Vias;
  a semiconductor chip disposed on the first surface of the silicon substrate and electrically connected to the Through Silicon Vias;
  an encapsulant formed on the first surface of the silicon substrate to encapsulate the semiconductor chip, wherein the encapsulant is free from being formed on a side surface of the silicon substrate;
  a hard component disposed on the encapsulant and free from being electrically connected to the semiconductor chip and the silicon substrate, wherein the encapsulant is formed between the hard component and the semiconductor chip and is free from being formed on an outside surface of the hard component so as to expose the hard component; and
  a plurality of conductive elements disposed on the second surface of the silicon substrate and electrically connected to the Through Silicon Vias.

2. The semiconductor package device of claim 1, wherein the Through Silicon Vias are filled with a conductive material selected from the group consisting of Cu and Ni/Au.

3. The semiconductor package device of claim 1, wherein the hard component is made of one of a glass material, a thermosetting material and a metal material.

4. The semiconductor package device of claim 1, wherein the conductive elements are solder bumps.

5. The semiconductor package device of claim 1, wherein an underfill adhesive is filled between the semiconductor chip and the silicon substrate.

6. A semiconductor package structure, comprising:
  a silicon substrate having a first surface and an opposed second surface and a plurality of Through Silicon Vias;
  a semiconductor chip disposed on the first surface of the silicon substrate and electrically connected to the Through Silicon Vias;
  an encapsulant formed on the first surface of the silicon substrate to encapsulate the semiconductor chip, wherein the encapsulant is free from being formed on a side surface of the silicon substrate;
  a hard component disposed on the encapsulant and free from being electrically connected to the semiconductor chip and the silicon substrate, wherein the encapsulant is formed between the hard component and the semiconductor chip and is free from being formed on an outside surface of the hard component so as to expose the hard component;
  a plurality of conductive elements disposed on the second surface of the silicon substrate and electrically connected to the Through Silicon Vias; and
  a carrier disposed to the conductive elements and electrically connected to the semiconductor chip through the conductive elements.

7. The semiconductor package structure of claim 6, wherein the Through Silicon Vias are filled with a conductive material selected from the group consisting of Cu and Ni/Au.

8. The semiconductor package structure of claim 6, wherein the hard component is made of one of a glass material, a thermosetting material and a metal material.

9. The semiconductor package structure of claim 6, wherein the conductive elements are solder bumps.

10. The semiconductor package structure of claim 6, wherein an underfill adhesive is filled between the semiconductor chip and the silicon substrate.

11. The semiconductor package structure of claim 6, wherein the carrier is one of a substrate, a circuit board and a lead frame.

* * * * *